United States Patent
Haneda (10) Patent No.: US 10,622,527 B2
(45) Date of Patent: Apr. 14, 2020

(54) INFRARED LED

(71) Applicant: ZEON CORPORATION, Chiyoda-ku, Tokyo (JP)

(72) Inventor: Tsutomu Haneda, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/314,091

(22) PCT Filed: Jul. 12, 2017

(86) PCT No.: PCT/JP2017/025407
§ 371 (c)(1),
(2) Date: Dec. 28, 2018

(87) PCT Pub. No.: WO2018/012534
PCT Pub. Date: Jan. 18, 2018

(65) Prior Publication Data
US 2019/0221729 A1   Jul. 18, 2019

(30) Foreign Application Priority Data
Jul. 14, 2016   (JP) ................. 2016-139071

(51) Int. Cl.
| | | |
|---|---|---|
| *H01L 33/58* | (2010.01) | |
| *H01L 33/20* | (2010.01) | |
| *G03F 7/023* | (2006.01) | |
| *G02B 3/00* | (2006.01) | |
| *C08L 65/00* | (2006.01) | |
| *C08L 63/00* | (2006.01) | |
| *G03F 7/004* | (2006.01) | |
| *H01L 33/44* | (2010.01) | |
| *H01L 33/56* | (2010.01) | |

(52) U.S. Cl.
CPC ............. *H01L 33/58* (2013.01); *C08L 63/00* (2013.01); *C08L 65/00* (2013.01); *G02B 3/00* (2013.01); *G03F 7/004* (2013.01); *G03F 7/023* (2013.01); *H01L 33/20* (2013.01); *H01L 33/44* (2013.01); *H01L 33/56* (2013.01)

(58) Field of Classification Search
CPC ................................ H01L 33/58; H01L 33/56
USPC ........................................................ 257/98
See application file for complete search history.

(56) References Cited

U.S. PATENT DOCUMENTS

| | | | |
|---|---|---|---|
| 2011/0297987 A1 | 12/2011 | Koizumi et al. | |
| 2012/0057100 A1* | 3/2012 | Masuda | B29C 33/3878 349/62 |

FOREIGN PATENT DOCUMENTS

| | | |
|---|---|---|
| JP | 2001339099 A | 12/2001 |
| WO | 2005096100 A1 | 10/2005 |

OTHER PUBLICATIONS

Aug. 29, 2017, International Search Report issued in the International Patent Application No. PCT/JP2017/025407.
(Continued)

*Primary Examiner* — Elias Ullah
(74) *Attorney, Agent, or Firm* — Kenja IP Law PC (57) ABSTRACT

An infrared LED comprising an insulating film formed on an element and a microlens formed on the insulating film, wherein the insulating film and the microlens are formed using radiation-sensitive resin compositions each containing a cyclic olefin polymer (A) having a protonic polar group, a radiation-sensitive compound (B), and a cross-linking agent (C), is provided.

6 Claims, 2 Drawing Sheets

(56) References Cited

OTHER PUBLICATIONS

Jan. 15, 2020, the Extended European Search Report issued by the European Patent Office in the corresponding European Patent Application No. 17827660.6.

\* cited by examiner

INFRARED LED

TECHNICAL FIELD

The present disclosure relates to an infrared LED, more particularly to an infrared LED having a high brightness and a high reliability.

BACKGROUND ART

Infrared LED (light emitting diode) with light emitting wavelengths in the infrared region (700 to 1500 nm) is widely used for photocouplers, light sources of remote controllers, and other infrared communications.

Among such infrared LED, ones using $Ga_{1-x}Al_xAs$-based compound semiconductors or GaAs-based compound semiconductors etc. are known (for example, see Patent Document 1).

RELATED ART

Patent Documents

Patent Document 1: Japanese Patent Publication No. 2001-339099A

SUMMARY OF THE INVENTION

Problem to be Solved by the Invention

In the infrared LED disclosed in the above-mentioned Patent Document 1 etc., it is a general that a surface protective film for preventing deterioration or damage is formed on an element and a microlens having a lens diameter of 2 to 10 µm or so on the surface protective film is formed. Among these, as the surface protective film, an inorganic film such as $SiN_x$ is generally used, but the transmittance in the infrared region is low, so there was the problem that the brightness as the infrared LED ended up becoming lower.

Further, as the microlens formed on the surface protective films, ones formed by using a radiation-sensitive resin composition to form dot patterns, then heat treating them to make the patterns deform have generally been used. Such a microlens is heat treated at a high temperature (melt flow) in the shaping process or the process of forming interconnects or other ancillary parts, but at this time, if the heat resistant shape retention ability of the radiation-sensitive resin composition is insufficient, the lens will deform in shape and the pattern shape will not be able to be maintained resulting in the inability to function as microlens any longer. For this reason, from the viewpoint of stably forming the desired deformed patterns and thereby making the infrared LED high in brightness, the radiation-sensitive resin composition used is being required to be excellent in transmittance and also to be excellent in heat resistant shape retention ability.

The present disclosure was made in consideration of such an actual situation and provides an infrared LED having a high brightness and high reliability.

Means for Solving the Problem

The inventor engaged in in-depth research to achieve the above object and as a result discovered that a radiation-sensitive resin composition comprised of a cyclic olefin polymer (A) having a protonic polar group, a radiation-sensitive compound (B), and a cross-linking agent (C) can give an insulating film excellent in light transmission ability (in particular, light transmission ability in infrared region (700 to 1500 nm)) and further excellent in heat resistant shape retention ability and further that in an infrared LED provided with an insulating film formed on an element and a microlens formed on the insulating film, forming the insulating film and microlens using such radiation-sensitive resin compositions enables the obtained infrared LED to be made high in brightness and high in reliability and thereby completed the present disclosure.

That is, according to the present disclosure, there are provided:

[1] An infrared LED comprising an insulating film formed on an element and a microlens formed on the insulating film, wherein the insulating film and the microlens are formed using radiation-sensitive resin compositions each containing a cyclic olefin polymer (A) having a protonic polar group, a radiation-sensitive compound (B), and a cross-linking agent (C),

[2] The infrared LED according to [1], wherein a thickness of the insulating film is 1 to 10 µm and a thickness of the microlens is 0.5 to 5 µm,

[3] The infrared LED according to [1] or [2], wherein a ratio of a thickness of the insulating film and a thickness of the microlens is a "thickness of insulating film:thickness of microlens" of 1:1 to 10:1,

[4] The infrared LED according to any one of [1] to [3], wherein a difference of a refractive index of the insulating film and a refractive index of the microlens is 0.1 or less,

[5] The infrared LED according to any one of [1] to [4], wherein the insulating film and the microlens are formed respectively using radiation-sensitive resin compositions containing the same polymer as the cyclic olefin polymer (A),

[6] The infrared LED according to [5], wherein the insulating film and the microlens are formed respectively using radiation-sensitive resin compositions comprised of entirely the same constituents, and

[7] The infrared LED according to [6], wherein the insulating film and the microlens are formed respectively using radiation-sensitive resin compositions comprising entirely the same constituents in the same ratios of content.

Effects of Invention

According to the present disclosure, it is possible to provide an infrared LED with a high brightness and a high reliability.

DESCRIPTION OF EMBODIMENTS

The infrared LED of the present disclosure comprises an insulating film formed on an element and a microlens formed on the insulating film, in which infrared LED, the insulating film and the microlens are formed using radiation-sensitive resin compositions each containing a cyclic olefin polymer (A) having a protonic polar group, a radiation-sensitive compound (B), and a cross-linking agent (C).

(Constitution of Infrared LED)

Below, an infrared LED 10 according to one embodiment of the present disclosure shown in FIG. 1 will be illustrated to explain the present disclosure in detail. However, the present disclosure is not particularly limited to the embodiment shown in FIG. 1.

Figure 1:
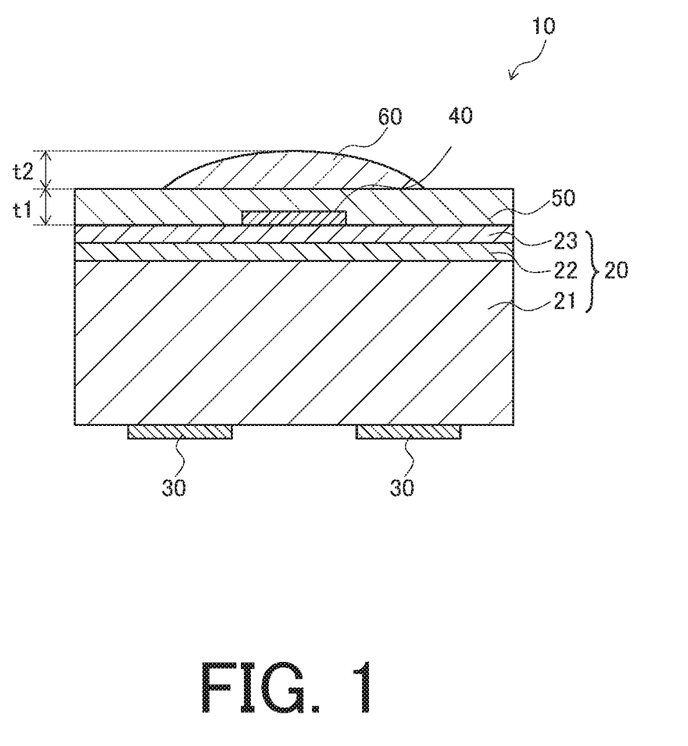
FIG. 1 is a cross-sectional view of an infrared LED according to one embodiment of the present disclosure.

As shown in FIG. 1, the infrared LED 10 according to one embodiment of the present disclosure is comprised of an epitaxial wafer 20, a plurality of n-dot electrodes 30 formed on one main surface of this epitaxial wafer 20, and a p-pad electrode 40 formed on the other main surface of the epitaxial wafer 20. Further, the infrared LED 10 according to one embodiment of the present disclosure further comprises a protective insulating film 50 and a microlens 60 formed on the protective insulating film 50 on the main surface of the element body formed by the epitaxial wafer 20, n-dot electrodes 30, and p-pad electrode 40 at the side where the p-pad electrode 40 is formed.

The epitaxial wafer 20, as shown in FIG. 1, comprises an AlGaAs substrate ($Ga_{1-x}Al_xAs$ substrate ($0 \leq x \leq 1$)) 21, an epitaxial layer 22 formed on the AlGaAs substrate 21, and a transparent conductive film 23 formed on the epitaxial layer 22.

The AlGaAs substrate 21 is not particularly limited, but, for example, a GaAs substrate, a GaAs substrate on which an AlGaAs layer is formed, and also just an AlGaAs layer etc. may be used.

The epitaxial layer 22 is a layer including an active layer formed on the AlGaAs substrate 21 by the OMVPE (organometallic vapor phase epitaxy) method, the MBE (molecular beam epitaxy) method, etc. As such an active layer, one having a multiple quantum well structure (MQW structure) of an alternately stacked well layer and barrier layer with a larger bandgap than the well layer etc. may be suitably mentioned.

The transparent conductive film 23 is a layer on the top of the epitaxial wafer 20 for spreading the current. Due to this, current is injected into the active layer contained in the epitaxial layer 22 over the entire surface of the element whereby light can be suitably emitted. As the transparent conductive film 23, for example, ITO composed of indium oxide ($In_2O_3$) doped with tin (Sn), indium oxide ($In_2O_3$), IFO composed of $In_2O_3$ doped with fluorine (F), tin oxide ($SnO_2$), ATO composed of $SnO_2$ doped with antimony (Sb), FTO composed of $SnO_2$ doped with fluorine, CTO composed of $SnO_2$ doped with cadmium (Cd), AZO composed of zinc oxide (ZnO) doped with aluminum (Al), IZO composed of ZnO doped with In, GZO composed of ZnO doped with Ga, etc. may be mentioned, but among these, ITO is preferable. The transparent conductive film 23 is formed using electron beam vapor deposition or sputtering etc.

The n-dot electrodes 30 are electrodes formed in dot shapes on one main surface of the epitaxial wafer 20. The n-dot electrodes 30 may be ones formed from a material having conductivity. It is not particularly limited, but, for example, may be formed by an alloy of Au (gold) and Ge (germanium).

The p-pad electrode 40 is an electrode formed on the surface of the epitaxial wafer 20 at the opposite side to the surface where the n-dot electrodes 30 are formed. The p-pad electrode 40 may be one formed from a material having conductivity. It is not particularly limited, but, for example, may be formed by an alloy of Au (gold) and Zn (zinc). To enable light to be taken out, the p-pad electrode 40 is formed in a manner where it covers only part of the surface of the epitaxial wafer 20 and leaves the rest exposed.

The protective insulating film 50 is an insulating protective film for protecting the element body formed by the epitaxial wafer 20, n-dot electrodes 30, and p-pad electrode 40. The protective insulating film 50 is formed on the surface of the transparent conductive film 23 forming the epitaxial wafer 20 so as to cover the p-pad electrode 40. In the present disclosure, the protective insulating film 50 is formed using a later explained radiation-sensitive resin composition comprised of a cyclic olefin polymer (A) having a protonic polar group, a radiation-sensitive compound (B), and a cross-linking agent (C).

The microlens 60 is a lens formed on the protective insulating film 50 and having a lens diameter of 2 to 10 μm or so. In the present disclosure, the microlens 60 is formed using a later explained radiation-sensitive resin composition comprised of a cyclic olefin polymer (A) having a protonic polar group, a radiation-sensitive compound (B), and a cross-linking agent (C).

(Radiation-Sensitive Resin Composition)

Next, the radiation-sensitive resin composition for forming the protective insulating film 50 and microlens 60 will be explained.

The radiation-sensitive resin composition for forming the protective insulating film 50 and microlens 60 is a resin composition having radiation-sensitivity containing a cyclic olefin polymer (A) having a protonic polar group, a radiation-sensitive compound (B), and a cross-linking agent (C).

The cyclic olefin polymer (A) having a protonic polar group (below, simply referred to as the "cyclic olefin polymer (A)") is a homopolymer or a copolymer of a cyclic olefin monomer which has a cyclic structure of cyclic olefin monomer unit (alicyclic or aromatic ring) and has a protonic polar group. Note that, the cyclic olefin polymer (A) may have a monomer unit derived from a monomer other than the cyclic olefin monomer.

Here, the "protonic polar group" means a group which contains an atom belonging to Group XV or Group XVI of the Periodic Table to which a hydrogen atom directly bonds. Among the atoms belonging to Group XV or Group XVI of the Periodic Table, atoms belonging to Period 1 or Period 2 of Group XV or Group XVI of the Periodic Table are preferable, an oxygen atom, nitrogen atom, or sulfur atom is more preferable, and an oxygen atom is particularly preferable.

As specific examples of such a protonic polar group, a hydroxyl group, carboxy group (hydroxycarbonyl group), sulfonic acid group, phosphoric acid group, and other polar groups which have oxygen atoms; primary amino group, secondary amino group, primary amide group, secondary amide group (imide group), and other polar groups which have nitrogen atoms; a thiol group and other polar groups which have sulfur atoms; etc. may be mentioned. Among these as well, ones which have oxygen atoms are preferable, carboxy group is more preferable.

In the present disclosure, the number of protonic polar groups which bond with the cyclic olefin polymer which has protonic polar groups is not particularly limited. Further, different types of protonic polar groups may also be included.

As specific examples of the cyclic olefin monomer which has a protonic polar group (a) (below, suitably called the "monomer (a)"), a carboxy group-containing cyclic olefin such as 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylm- ethylbicyclo[2.2.1]hept-5-ene, 2-hydroxycarbonyl-2-propoxycarbonylmethylbicyclo[2.2.1]hept-5-ene, 2-hydroxycarbonyl-2-butoxycarbonylmethylbicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1]hept-5-ene, 2-hydroxycarbonyl-2-naphthyloxycarbonylmethylbicyclo[2.2.1]hept-5-ene, 2-hydroxycarbonyl-2-biphenyloxycarbonylmethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyloxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.1]hept-5-ene, 2-hydroxycarbonyl-3-biphenyloxycarbonylbicyclo[2.2.1]hept-5-ene, 2-hydroxycarbonyl-3-benzyloxycarbonylbicyclo[2.2.1]hept-5-ene, 2-hydroxycarbonyl-3-hydroxyethoxycarbonylbicyclo[2.2.1]hept-5-ene, 2-hydroxycarbonyl-3-hydroxycarbonylmethylbicyclo[2.2.1]hept-5-ene, 3-methyl-2-hydroxycarbonylbicyclo[2.2.1]hept-5-ene, 3-hydroxymethyl-2-hydroxycarbonylbicyclo[2.2.1]hept-5-ene, 2-hydroxycarbonyltricyclo[5.2.1.0$^{2,6}$]deca-3,8-diene, 4-hydroxycarbonyltetracyclo[6.2.1.1$^{3,6}$.0$^{2,7}$]dodec-9-ene, 4-methyl-4-hydroxycarbonyltetracyclo[6.2.1.1$^{3,6}$.0$^{2,7}$]dodec-9-ene, 4,5-dihydroxycarbonyltetracyclo[6.2.1.1$^{3,6}$.0$^{2,7}$]dodec-9-ene, 4-carboxymethyl-4-hydroxycarbonyltetracyclo[6.2.1.1$^{3,6}$.0$^{2,7}$]dodec-9-ene, N-(hydroxycarbonylmethyl)bicyclo[2.2.1]hept-5-ene-2,3-dicarboxyimide, N-(hydroxycarbonylethyl)bicyclo[2.2.1]hept-5-ene-2,3-dicarboxyimide, N-(hydroxycarbonylpentyl)bicyclo[2.2.1]hept-5-ene-2,3-dicarboxyimide, N-(dihydroxycarbonylethyl)bicyclo[2.2.1]hept-5-ene-2,3-dicarboxyimide, N-(dihydroxycarbonylpropyl)bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydroxycarbonyl)ethyl)bicyclo[2.2.1]hept-5-ene-2,3-dicarboxyimide, and N-(hydroxycarbonylphenyl)bicyclo[2.2.1]hept-5-ene-2,3-dicarboxyimide; a hydroxyl group-containing cyclic olefin such as 2-(4-hydroxyphenyl)bicyclo[2.2.1]hept-5-ene, 2-methyl-2-(4-hydroxyphenyl)bicyclo[2.2.1]hept-5-ene, 4-(4-hydroxyphenyl)tetracyclo[6.2.1.1$^{3,6}$.0$^{2,7}$]dodec-9-ene, 4-methyl-4-(4-hydroxyphenyl)tetracyclo[6.2.1.1$^{3,6}$.0$^{2,7}$]dodec-9-ene, 2-hydroxybicyclo[2.2.1]hept-5-ene, 2-hydroxymethylbicyclo[2.2.1]hept-5-ene, 2-hydroxyethylbicyclo[2.2.1]hept-5-ene, 2-methyl-2-hydroxymethylbicyclo[2.2.1]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluoromethyl-3,3,3-trifluoropropyl)bicyclo[2.2.1]hept-5-ene, 3-hydroxytricyclo[5.2.1.0$^{2,6}$]deca-4,8-diene, 3-hydroxymethyltricyclo[5.2.1.0$^{2,6}$]deca-4,8-diene, 4-hydroxytetracyclo[6.2.1.1$^{3,6}$.0$^{2,7}$]dodec-9-ene, 4-hydroxymethyltetracyclo[6.2.1.1$^{3,6}$.0$^{2,7}$]dodec-9-ene, 4,5-dihydroxymethyltetracyclo[6.2.1.1$^{3,6}$.0$^{2,7}$]dodec-9-ene, 4-(hydroxyethoxycarbonyl)tetracyclo[6.2.1.1$^{3,6}$.0$^{2,7}$]dodec-9-ene, 4-methyl-4-(hydroxyethoxycarbonyl)tetracyclo[6.2.1.1$^{3,6}$.0$^{2,7}$]dodec-9-ene, N-(hydroxyethyl)bicyclo[2.2.1]hept-5-ene-2,3-dicarboxyimide, and N-(hydroxyphenyl)bicyclo[2.2.1]hept-5-ene-2,3-dicarboxyimide etc. may be mentioned. Among these as well, from the viewpoint of the adhesion of the obtained protective insulating film 50 and microlens 60, particularly, the adhesion of the obtained protective insulating film 50 to the transparent conductive film 23, carboxy group-containing cyclic olefins are preferable, while 4-hydroxycarbonyltetracyclo[6.2.1.1$^{3,6}$.0$^{2,7}$]dodec-9-ene is particularly preferable. These monomers (a) may respectively be used alone or may be used as two types or more combined.

In the cyclic olefin polymer (A), the ratio of content of the unit of the monomer (a) is preferably 10 to 90 mol % with respect to all monomer units, more preferably 40 to 70 mol %, still more preferably 50 to 60 mol %. If the content of the unit of the monomer (a) is within the above range, the radiation sensitivity can be sufficient, and furthermore, the generation of the dissolution residue at the time of development can be effectively prevented, due to this, the protective insulating film 50 and microlens 60 can be suitably formed, so this is preferable.

Further, the cyclic olefin polymer (A) used in the present disclosure may be a copolymer which is obtained by copolymerization of a cyclic olefin monomer which has a protonic polar group (a) and a monomer (b) which can copolymerize with this. As such a copolymerizable monomer, a cyclic olefin monomer which has a polar group other than a protonic polar group (b1), a cyclic olefin monomer which does not have a polar group (b2), and a monomer other than a cyclic olefin (b3) (below, suitably called the "monomer (b1)", "monomer (b2)", and "monomer (b3)") may be mentioned.

As the cyclic olefin monomer which has a polar group other than a protonic polar group (b1), for example, a cyclic olefin which has an N-substituted imide group, ester group, cyano group, acid anhydride group, or halogen atom may be mentioned.

As a cyclic olefin which has an N-substituted imide group, for example, a monomer represented by the following formula (1) or a monomer represented by the following formula (2) may be mentioned.

(1)

(In the above formula (1), R indicates a hydrogen atom or alkyl group or aryl group having 1 to 16 carbon atoms. "n" indicates an integer of 1 to 2.)

(2)

(In the above formula (2), $R^2$ indicates a bivalent alkylene group having 1 to 3 carbon atoms, while $R^3$ indicates a monovalent alkyl group having 1 to 10 carbon atoms or a monovalent halogenated alkyl group having 1 to 10 carbon atoms.)

In the above formula (1), $R^1$ is an alkyl group or aryl group having 1 to 16 carbon atoms. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, and other straight chain alkyl groups; cyclopropyl group, cyclobutyl group, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, 1-methylnonyl group, 1-methyltridecyl group, 1-methyltetradecyl group, and other branched alkyl groups; etc. may be mentioned. Further, as specific examples of the aryl group, a benzyl group etc. may be mentioned. Among these as well, due to the more excellent heat resistance and solubility in a polar solvent, an alkyl group and aryl group having 6 to 14 carbon atoms are preferable, while an alkyl group and aryl group having 6 to 10 carbon atoms are more preferable. If the number of carbon atoms is 4 or less, the solubility in a polar solvent is inferior, while if the number of carbon atoms is 17 or more, the heat resistance is inferior. Further, when patterning the resin film which is obtained using the radiation-sensitive resin composition, there is the problem that the resin film melts by heat and the patterns to end up disappearing.

As specific examples of the monomer represented by the above general formula (1), bicyclo[2.2.1]hept-5-ene-2,3-dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)-bicyclo[2.2.1]hept-5-ene-2,3-dicarboxyimide, N-(2-methylbutyl)-bicyclo[2.2.1]hept-5-ene-2,3-dicarboxyimide, N-(1-methylpentyl)-bicyclo[2.2.1]hept-5-ene-2,3-dicarboxyimide, N-(2-methylpentyl)-bicyclo[2.2.1]hept-5-ene-2,3-dicarboxyimide, N-(1-ethylbutyl)-bicyclo[2.2.1]hept-5-ene-2,3-dicarboxyimide, N-(2-ethylbutyl)-bicyclo[2.2.1]hept-5-ene-2,3-dicarboxyimide, N-(1-methylhexyl)-bicyclo[2.2.1]hept-5-ene-2,3-dicarboxyimide, N-(2-methylhexyl)-bicyclo[2.2.1]hept-5-ene-2,3-dicarboxyimide, N-(3-methylhexyl)-bicyclo[2.2.1]hept-5-ene-2,3-dicarboxyimide, N-(1-butylpentyl)-bicyclo[2.2.1]hept-5-ene-2,3-dicarboxyimide, N-(2-butylpentyl)-bicyclo[2.2.1]hept-5-ene-2,3-dicarboxyimide, N-(1-methylheptyl)-bicyclo[2.2.1]hept-5-ene-2,3-dicarboxyimide, N-(2-methylheptyl)-bicyclo[2.2.1]hept-5-ene-2,3-dicarboxyimide, N-(3-methylheptyl)-bicyclo[2.2.1]hept-5-ene-2,3-dicarboxyimide, N-(4-methylheptyl)-bicyclo[2.2.1]hept-5-ene-2,3-dicarboxyimide, N-(1-ethylhexyl)-bicyclo[2.2.1]hept-5-ene-2,3-dicarboxyimide, N-(2-ethylhexyl)-bicyclo[2.2.1]hept-5-ene-2,3-dicarboxyimide, N-(3-ethylhexyl)-bicyclo[2.2.1]hept-5-ene-2,3-dicarboxyimide, N-(1-propylpentyl)-bicyclo[2.2.1]hept-5-ene-2,3-dicarboxyimide, N-(2-propylpentyl)-bicyclo[2.2.1]hept-5-ene-2,3-dicarboxyimide, N-(1-methyloctyl)-bicyclo[2.2.1]hept-5-ene-2,3-dicarboxyimide, N-(2-methyloctyl)-bicyclo[2.2.1]hept-5-ene-2,3-dicarboxyimide, N-(3-methyloctyl)-bicyclo[2.2.1]hept-5-ene-2,3-dicarboxyimide, N-(4-methyloctyl)-bicyclo[2.2.1]hept-5-ene-2,3-dicarboxyimide, N-(1-ethylheptyl)-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)-bicyclo[2.2.1]hept-5-ene-2,3-dicarboxyimide, N-(4-ethylheptyl)-bicyclo[2.2.1]hept-5-ene-2,3-dicarboxyimide, N-(1-propylhexyl)-bicyclo[2.2.1]hept-5-ene-2,3-dicarboxyimide, N-(2-propylhexyl)-bicyclo[2.2.1]hept-5-ene-2,3-dicarboxyimide, N-(3-propylhexyl)-bicyclo[2.2.1]hept-5-ene-2,3-dicarboxyimide, N-(1-methylnonyl)-bicyclo[2.2.1]hept-5-ene-2,3-dicarboxyimide, N-(2-methylnonyl)-bicyclo[2.2.1]hept-5-ene-2,3-dicarboxyimide, N-(3-methylnonyl)-bicyclo[2.2.1]hept-5-ene-2,3-dicarboxyimide, N-(4-methylnonyl)-bicyclo[2.2.1]hept-5-ene-2,3-dicarboxyimide, N-(5-methylnonyl)-bicyclo[2.2.1]hept-5-ene-2,3-dicarboxyimide, N-(1-ethyloctyl)-bicyclo[2.2.1]hept-5-ene-2,3-dicarboxyimide, N-(2-ethyloctyl)-bicyclo[2.2.1]hept-5-ene-2,3-dicarboxyimide, N-(3-ethyloctyl)-bicyclo[2.2.1]hept-5-ene-2,3-dicarboxyimide, N-(4-ethyloctyl)-bicyclo[2.2.1]hept-5-ene-2,3-dicarboxyimide, N-(1-methyldecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methylundecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methyltridecyl)-bicyclo[2.2.1]hept-5-ene-2,3-dicarboxyimide, N-(1-methyltetradecyl)-bicyclo[2.2.1]hept-5-ene-2,3-dicarboxyimide, N-(1-methylpentadecyl)-bicyclo[2.2.1]hept-5-ene-2,3-dicarboxyimide, N-phenyl-tetracyclo[$6.2.1.1^{3,6}.0^{2,7}$]dodec-9-ene-4,5-dicarboxyimide, N-(2,4-dimethoxyphenyl)-tetracyclo[$6.2.1.1^{3,6}.0^{2,7}$]dodec-9-ene-4,5-dicarboxyimide, etc. may be mentioned. Note that, these may respectively be used alone or may be used as two types or more combined.

On the other hand, in the above formula (2), $R^2$ is a bivalent alkylene group having 1 to 3 carbon atoms. As the bivalent alkylene group having 1 to 3 carbon atoms, a methylene group, ethylene group, propylene group, and isopropylene group may be mentioned. Among these as well, due to the excellent polymerization activity, a methylene group and ethylene group are preferable.

Further, in the above formula (2), $R^3$ is a monovalent alkyl group having 1 to 10 carbon atoms or monovalent halogenated alkyl group having 1 to 10 carbon atoms. As the monovalent alkyl group having 1 to 10 carbon atoms, for example, a methyl group, ethyl group, propyl group, isopropyl group, butyl group, sec-butyl group, tert-butyl group, hexyl group, cyclohexyl group, etc. may be mentioned. As the monovalent halogenated alkyl group having 1 to 10 carbon atoms, for example, a fluoromethyl group, chloromethyl group, bromomethyl group, difluoromethyl group, dichloromethyl group, difluoromethyl group, trifluoromethyl group, trichloromethyl group, 2,2,2-trifluoroethyl group, pentafluoroethyl group, heptafluoropropyl group, perfluorobutyl group, perfluoropentyl group, etc. may be mentioned. Among these as well, since the solubility in a polar solvent is excellent, as $R^3$, a methyl group or ethyl group is preferable.

Note that, the monomer represented by the above formulas (1) and (2) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 2-acetoxybicyclo[2.2.1]hept-5-ene, 2-acetoxymethylbicyclo [2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo [2.2.1]hept-5-ene, 2-cyclohexyloxycarbonylbicyclo[2.2.1] hept-5-ene, 2-methyl-2-methoxycarbonylbicyclo[2.2.1] hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo [2.2.1]hept-5-ene, 2-methoxycarbonyltricyclo[5.2.1.0$^{2,6}$] dec-8-ene, 2-ethoxycarbonyltricyclo [5.2.1.0$^{2,6}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltetracyclo[6.2.1.1$^{3,6}$.0$^{2,7}$]dodec-9-ene, 4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyltetracyclo[6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyltetracyclo[6.2.1.1$^{3,6}$.0$^{2,7}$]dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo [6.2.1.1$^{3,6}$.0$^{2,7}$]dodec-9-ene, etc. may be mentioned.

As the cyclic olefin which has a cyano group, for example, 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1] hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-9-ene-4,5-dicarboxylic anhydride, bicyclo[2.2.1]hept-5-ene-2,3-dicarboxylic anhydride, 2-carboxymethyl-2-hydroxycarbonylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1] hept-5-ene, 4-chlorotetracyclo[6.2.1.1$^{3,6}$.0$^{2,7}$]dodec-9-ene, 4-methyl-4-chlorotetracyclo[6.2.1.1$^{3,6}$.0$^{2,7}$]dodec-9-ene, etc. may be mentioned.

These monomers (b1) may respectively be used alone or may be used as two types or more combined.

As the cyclic olefin monomer which does not have a polar group (b2), bicyclo[2.2.1]hept-2-ene (also called "norbornene"), 5-ethylbicyclo[2.2.1]hept-2-ene, 5-butyl-bicyclo [2.2.1]hept-2-ene, 5-ethylidene-bicyclo[2.2.1]hept-2-ene, 5-methylidene-bicyclo[2.2.1]hept-2-ene, 5-vinyl-bicyclo [2.2.1]hept-2-ene, tricyclo[5.2.1.0$^{2,6}$]deca-3,8-diene (common name: dicyclopentadiene), tetracyclo[10.2.1.0$^{2,11}$.0$^{4,9}$] pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo [6.2.1.1$^{3,6}$.0$^{2,7}$]dodec-4-ene, 9-methylidene-tetracyclo [6.2.1.1$^{3,6}$.0$^{2,7}$]dodec-4-ene, 9-ethylidene-tetracyclo [6.2.1.1$^{3,6}$.0$^{2,7}$]dodec-4-ene, 9-vinyl-tetracyclo[6.2.1.1$^{3,6}$. 0$^{2,7}$]dodec-4-ene, 9-propenyl-tetracyclo[6.2.1.1$^{3,6}$.0$^{2,7}$]dodec-4-ene, pentacyclo[9.2.1.1$^{3,9}$.0$^{2,10}$. 0$^{4,8}$]pentadeca-5,12-diene, cyclobutene, cyclopentene, cyclopentadiene, cyclohexene, cycloheptene, cyclooctene, cyclooctadiene, indene, 3a,5,6,7a-tetrahydro-4,7-methano-1H-indene, 9-phenyl-tetracyclo[6.2.1.1$^{3,6}$.0$^{2,7}$]dodec-4-ene, tetracyclo[9.2. 1.0$^{2,10}$.0$^{3,8}$]tetradec-3,5,7,12-tetraene, pentacyclo[9.2.1. 1$^{3,9}$.0$^{2,10}$.0$^{4,8}$]pentadec-12-ene, etc. may be mentioned.

These monomers (b2) may respectively be used alone or may be used as two types or more combined.

As specific examples of the monomer other than a cyclic olefin (b3), ethylene; propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ α-olefins; 1,4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable.

These monomers (b3) may respectively be used alone or may be used as two types or more combined.

Among these monomers (b1) to (b3) as well, from the viewpoint of the effect of the present disclosure becoming more remarkable, a cyclic olefin monomer which has a polar group other than a protonic polar group (b1) is preferable, while a cyclic olefin which has an N-substituted imide group is particularly preferable.

In the cyclic olefin polymer (A), the ratio of content of units of the copolymerizable monomer (b) is preferably 10 to 90 mol % with respect to the total monomer units, more preferably 30 to 60 mol %, still more preferably 40 to 50 mol %. If the content of the units of the monomer (a) is within the above range, the radiation-sensitivity can be improved while the solubility in a polar solvent of the cyclic olefin polymer (A) can be suitable, and furthermore, the generation of the dissolution residue at the time of development can be effectively prevented, due to this, the protective insulating film 50 and microlens 60 can be suitably formed, so this is preferable.

Note that, in the present disclosure, it is also possible to introduce a protonic group in a cyclic olefin-based polymer which does not have a protonic polar group utilizing a known modifying agent so as to obtain the cyclic olefin polymer (A).

The polymer which does not have a protonic polar group can be obtained by polymerizing at least one of the above-mentioned monomers (b1) and (b2) and, in accordance with need, a monomer (b3) in any combination.

As a modifying agent for introduction of a protonic polar group, usually a compound which has a protonic polar group and a reactive carbon-carbon unsaturated bond in a single molecule is used.

As specific examples of this compound, acrylic acid, methacrylic acid, angelic acid, tiglic acid, oleic acid, elaidic acid, erucic acid, brassidic acid, maleic acid, fumaric acid, citraconic acid, mesaconic acid, itaconic acid, atropic acid, cinnamic acid, or other unsaturated carboxylic acid; allyl alcohol, methylvinyl methanol, crotyl alcohol, methacryl alcohol, 1-phenylethen-1-ol, 2-propen-1-ol, 3-buten-1-ol, 3-buten-2-ol, 3-methyl-3-buten-1-ol, 3-methyl-2-buten-1-ol, 2-methyl-3-buten-2-ol, 2-methyl-3-buten-1-ol, 4-penten-1-ol, 4-methyl-4-penten-1-ol, 2-hexen-1-ol, or other unsaturated alcohol; etc. may be mentioned.

The modification reaction of a polymer in which these modifying agents are used may be performed in accordance with an ordinary method and is usually performed in the presence of a radical generator.

Note that, the cyclic olefin polymer (A) used in the present disclosure may be a ring-opened polymer obtained by ring-opening polymerization of the above-mentioned monomers or may be an addition polymer obtained by addition polymerization of the above-mentioned monomers, but from the viewpoint of the effect of the present disclosure becoming more remarkable, a ring-opened polymer is preferable.

A ring-opened polymer can be produced by ring-opening methathesis polymerization of a cyclic olefin monomer which has a protonic polar group (a) and a copolymerizable monomer (b) used according to need in the presence of a methathesis reaction catalyst. As the method of production, for example, the method described in International Publication No. 2010/110323A, [0039] to [0079], etc. can be used.

Further, when the cyclic olefin polymer (A) used in the present disclosure is a ring-opened polymer, it is preferable to further perform a hydrogenation reaction and obtain a hydrogenated product in which the carbon-carbon double bonds which are contained in the main chain are hydrogenated. When the cyclic olefin polymer (A) is a hydrogenated product, the ratio of the hydrogenated carbon-carbon double bonds (hydrogenation rate) is usually 50% or more. From the viewpoint of the heat resistance, 70% or more is preferable, 90% or more is more preferable, and 95% or more is furthermore preferable.

The cyclic olefin polymer (A) used in the present disclosure has a weight average molecular weight (Mw) of usually 1,000 to 1,000,000, preferably 1,500 to 100,000, more preferably 2,000 to 30,000 in range.

Further, the cyclic olefin polymer (A) has a molecular weight distribution of a weight average molecular weight/number average molecular weight (Mw/Mn) ratio of usually 4 or less, preferably 3 or less, more preferably 2.5 or less.

The weight average molecular weight (Mw) and molecular weight distribution (Mw/Mn) of the cyclic olefin polymer (A) are values which are found by gel permeation chromatography (GPC) using a solvent such as tetrahydrofuran as an eluent and as values converted to polystyrene.

The radiation-sensitive compound (B) is a compound able to undergo a chemical reaction by being irradiated with radiation such as ultraviolet rays or electron beams. As the radiation-sensitive compound (B), one able to control the alkali solubility of the resin film formed from the radiation-sensitive resin composition is preferable, in particular, a photoacid generator is preferable.

As such a radiation-sensitive compound (B), for example, an acetophenone compound, triarylsulfonium salt, an azide compound such as a quinone diazide compound, etc. may be mentioned, but it is preferably an azide compound, particularly preferably a quinone diazide compound.

As the quinone diazide compound, for example, an ester compound of a quinone diazide sulfonic acid halide and a compound having a phenolic hydroxyl group may be used. As specific examples of a quinone diazide sulfonic acid halide, 1,2-naphthoquinone diazide-5-sulfonic acid chloride, 1,2-naphtoquinone diazide-4-sulfonic acid chloride, 1,2-benzoquinone diazide-5-sulfonic acid chloride, etc. may be mentioned. As representative examples of a compound having a phenolic hydroxyl group, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, etc. may be mentioned. As compounds having a phenolic hydroxyl group other than these, 2,3,4-trihydroxybenzophenone, 2,3,4,4'-tetrahydroxybenzophenone, 2-bis(4-hydroxyphenyl)propane, tris(4-hydroxyphenyl)methane, 1,1,1-tris(4-hydroxy-3-methylphenyl)ethane, 1,1,2,2-tetrakis(4-hydroxyphenyl)ethane, an oligomer of a novolac resin, an oligomer obtained by copolymerization of a compound having one or more phenolic hydroxyl groups and dicyclopentadiene, etc. may be mentioned.

Further, as the photoacid generator, other than a quinine diazide compound, a known one such as an onium salt, halogenated organic compound, α,α'-bis(sulfonyl)diazomethane-based compound, α-carbonyl-α'-sulfonyldiazomethane-based compound, sulfone compound, organic acid ester compound, organic acid amide compound, and an organic acid imide compound can be used.

These radiation-sensitive compounds may be used respectively alone or as two or more types combined.

In the radiation-sensitive resin composition used in the present disclosure, the content of the radiation-sensitive compound (B) is preferably 20 to 100 parts by weight with respect to 100 parts by weight of the cyclic olefin polymer (A), more preferably 25 to 70 parts by weight, still more preferably 30 to 50 parts by weight. By making the content of the radiation-sensitive compound (B) this range, it is possible to raise the radiation sensitivity of the resin film formed using the radiation-sensitive resin composition and thereby possible to enlarge the difference in solubility in a developing solution between irradiated parts (exposed parts) and unirradiated parts (unexposed parts) when patterning the resin film (contrast in solubility) and possible to facilitate patterning by development, so this is preferable.

The cross-linking agent (C) is one forming a cross-linked structure between molecules of the cross-linking agent by heating or one reacting with the cyclic olefin polymer (A) and forming a cross-linked structure between molecules of the resin. Specifically, a compound having two or more reactive groups may be mentioned. As such a reactive group, for example, an amino group, carboxy group, hydroxy group, epoxy group, and isocyanate group may be mentioned. More preferably, it is an amino group, epoxy group, or isocyanate group. An epoxy group is particularly preferable.

The weight average molecular weight of the cross-linking agent (C) is not particularly limited, but is usually 100 to 100,000, preferably 300 to 50,000, more preferably 500 to 10,000. If the weight average molecular weight of the cross-linking agent (C) is in the above range, the compatibility of the cross-linking agent (C) and cyclic olefin polymer (A) becomes good and the obtained resin film becomes a homogeneous film, so this is preferable.

Note that, the weight average molecular weight of the cross-linking agent (C) can be measured using gel permeation chromatography converted to polystyrene and otherwise analyzed by ordinary methods.

The cross-linking agents (C) may be respectively used alone or as two types or more combined.

As specific examples of the cross-linking agent (C), epoxy compounds such as a bisphenol A type epoxy resin, bisphenol F type epoxy resin, phenol novolac type epoxy resin, cresol novolac type epoxy resin, polyphenol type epoxy resin, cyclic aliphatic epoxy resin, aliphatic glycidyl ether, or epoxy acrylate polymer may be mentioned.

As specific examples of the epoxy compound, epoxy compounds having an alicyclic structure such as a trifunctional epoxy compound having a dicyclopentadiene skeleton (product name "XD-1000", made by Nippon Kayaku), 2,2-bis(hydroxymethyl)1-butanol⁽⁾ 1,2-epoxy-4-(2-oxiranyl) cyclohexane adduct (15-functional alicyclic epoxy resin having cyclohexane skeleton and end epoxy groups, product name "EHPE3150", made by Daicel), epoxylated 3-cyclohexene-1,2-dicarboxylic acid bis(3-cyclohexenylmethyl)-modified ε-caprolactone (aliphatic cyclic 3-functional epoxy resin, product name "Epolide GT301", made by Daicel), epoxylated butane tetracarboxylic acid tetrakis(3-cyclohexenylmethyl)-modified ε-caprolactone (aliphatic cyclic 4-functional epoxy resin, product name "Epolide GT401", made by Daicel), 3,4-epoxycyclohexenylmethyl-3',4'-epoxycyclohexene carboxylate (product name "Celloxide 2021", made by Daicel), 1,2:8,9-diepoxylimonene (product name "Celloxide 3000", made by Daicel), and 2-(3,4-epoxycyclohexyl)ethyl-trimethoxysilane (product name "Z-6043", made by Dow Corning Toray);

epoxy compounds not having an alicyclic structure such as an aromatic amine type polyfunctional epoxy compound (product name "H-434", made by Tohto Chemical Industry), tris(2,3-epoxypropyl)isocyanulate (polyfunctional epoxy compound having triazine skeleton, product name "TEPIC", made by Nissan Chemical Corporation), cresol novolac type polyfunctional epoxy compound (product name "EOCN-1020", made by Nippon Kayaku), phenol novolac type polyfunctional epoxy compound (Epicoat 152, 154, made by Japan Epoxy Resin), polyfunctional epoxy compound having a naphthalene skeleton (product name EXA-4700, made by DIC), a chain alkyl polyfunctional epoxy compound (product name "SR-TMP", made by Sakamoto Yakuhin Kogyo), polyfunctional epoxy polybutadiene (product name "Epolide PB3600", made by Daicel), a glycerin glycidyl polyether compound (product name "SR-GLG", made by Sakamoto Yakuhin Kogyo), a diglycerin polyglycidyl ether compound (product name "SR-DGE", made by Sakamoto Yakuhin Kogyo), a polyglycerin polyglycidyl ether compound (product name "SR-4GL", made by Sakamoto Yakuhin Kogyo), a glycidoxypropyltrimethylsilane (product name "Z-6040", made by Dow Corning Toray), etc. may be mentioned.

Among the above-mentioned epoxy compounds as well, polyfunctional epoxy compounds having two or more epoxy groups are preferable. Due to being able to make the resin film obtained using the radiation-sensitive resin composition more excellent in heat resistant shape retention ability, a polyfunctional epoxy compound having an alicyclic structure and having three or more epoxy groups is particularly preferable.

In the radiation-sensitive resin composition used in the present disclosure, the content of the cross-linking agent (C) is not particularly limited, but may be freely set considering the extent of heat resistance sought from the protective insulating film 50 and microlens 60 formed using the radiation-sensitive resin composition. The content of the cross-linking agent (C) is preferably 5 to 80 parts by weight with respect to 100 parts by weight of the cyclic olefin polymer (A), more preferably 20 to 75 parts by weight, still more preferably 25 to 70 parts by weight.

Further, the radiation-sensitive resin composition used in the present disclosure may also contain, in a range where the effect of the present disclosure is not diminished, as desired, other compounding agents such as a solvent, surfactant, compound having an acidic group, coupling agent or its derivative, sensitizer, antioxidant, photostabilizer, defoamer, pigment, dye, and filler.

The solvent is not particularly limited. One known as a solvent for resin compositions, for example, straight chain ketones such as acetone, methylethylketone, cyclopentanone, 2-hexanone, 3-hexanone, 2-heptanone, 3-heptanone, 4-heptanone, 2-octanone, 3-octanone, and 4-octanone; alcohols such as n-propyl alcohol, isopropyl alcohol, n-butyl alcohol, and cyclohexanol; ethers such as ethylene glycol dimethyl ether, ethylene glycol diethyl ether, and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl butyrate, ethyl butyrate, methyl lactate, and ethyl lactate; cellosolve esters such as cellosolve acetate, methyl cellosolve acetate, ethyl cellosolve acetate, propyl cellosolve acetate, and butyl cellosolve acetate; propylene glycols such as propylene glycol, propylene glycol monomethyl ether, propylene glycol monomethyl ether acetate, propylene glycol monoethyl ether acetate, propylene glycol monobutyl ether; diethylene glycols such as diethylene glycol monomethyl ether, diethylene glycol monoethyl ether, diethylene glycol dimethyl ether, diethylene glycol diethyl ether, and diethylene glycol methylethyl ether; saturated γ-lactones such as γ-butyrolactone, γ-valerolactone, γ-caprolactone, and γ-caprylolactone; halogenated hydrocarbons such as trichloroethylene; aromatic hydrocarbons such as toluene and xylene; polar solvents such as dimethyl acetoamide, dimethyl formamide, and N-methyl acetoamide, etc. may be mentioned. These solvents may be used alone or as two types or more combined. The content of the solvent is preferably 10 to 10000 parts by weight with respect to 100 parts by weight of the cyclic olefin polymer (A), more preferably 50 to 5000 parts by weight, still more preferably 100 to 1000 parts by weight in range. Note that, if making the radiation-sensitive resin composition contain a solvent, the solvent is usually removed after formation of the resin film.

The surfactant is used for the purposes of preventing striation and improving the developing ability. As specific examples of the surfactant, for example, polyoxyethylene alkyl ethers such as polyoxyethylene lauryl ether, polyoxyethylene stearyl ether, and polyoxyethylene oleyl ether; polyoxyethylene aryl ethers such as polyoxyethylene octylphenyl ether, and polyoxyethylene nonylphenyl ether; polyoxyethylene dialkyl esters such as polyoxyethylene dilaurate and polyoxyethylene distearate and other nonionic surfactants; fluorine-based surfactants; silicone-based surfactants; methacrylic acid copolymer-based surfactants; acrylic acid copolymer-based surfactants; etc. may be mentioned.

The compound having an acidic group is not particularly limited so long as one having an acidic group. An aliphatic compound, aromatic compound, and heterocyclic compound having an acidic group are preferable, while an aromatic compound and heterocyclic compound having an acidic group are more preferable. Note that, as the compound having an acidic group, for example, ones described in Japanese Patent Publication No. 2011-75610A, [0099] to [0105], etc. may be used.

Further, as the compound having an acidic group, since a similar effect is obtained, it is possible to use a latent acid generator. As the latent acid generator, a cationic polymerization catalyst generating an acid upon heating such as a sulfonium salt, benzothiazolium salt, ammonium salt, phosphonium salt, block carboxylic acid, etc. may be mentioned. Among these as well, block carboxylic acids are preferable.

As the coupling agent or its derivative, a compound having one atom selected from a silicon atom, titanium atom, aluminum atom, and zirconium atom and a hydrocarbyloxy group or hydroxy group bonded to that atom etc. may be used. As the coupling agent or its derivative, for example, ones described in Japanese Patent Publication No. 2011-75609A, [0104] to [0106] etc. may be used.

As specific examples of the sensitizer, 2H-pyrido-(3,2-b)-1,4-oxazin-3(4H)-ones, 10H-pyrido-(3,2-b)-1,4-benzothiazines, urazoles, hidantoins, barbiturates, glycine anhydrides, 1-hydroxybenzotriazoles, alloxanes, maleimides, etc. may be mentioned.

The antioxidant is not particularly limited, but, for example, one used for a usual polymer such as a phenol-based antioxidant, phosphorus-based antioxidant, sulfur-based antioxidant, amine-based antioxidant, lactone-based antioxidant, etc. may be used. As a phenol-based antioxidant, a conventionally known one may be used. For example, acrylate-based compounds described in Japanese Patent Publication No. 63-179953A or Japanese Patent Publication No. 1-168643A such as 2-t-butyl-6-(3-t-butyl-2-hydroxy-5-methylbenzyl)-4-methylphenylacrylate, and 2,4-di-t-amyl-6-[1-(3,5-di-t-amyl-2-hydroxyphenyl)ethyl] phenylacrylate; 2,6-di-t-butyl-4-methylphenol, p-methoxyphenol, styrenated phenol, n-octadecyl-3-(3',5'-di-t-butyl-4'-hydroxyphenyl)propionate, 2,2'-methylene-bis(4-methyl-6-t-butylphenol), 2-t-butyl-6-(3'-t-butyl-5'-methyl-2'-hydroxybenzyl)-4-methylphenylacrylate, 4,4'-butylidene-bis-(3-methyl-6-t-butylphenol), 4,4'-thio-bis(3-methyl-6-t-butylphenol), pentaerythritoltetrakis[3-(3,5-di-t-butyl-4-hydroxyphenyl) propionate], alkylated bisphenol, etc. may be mentioned.

As the phosphorus-based antioxidant, triphenyl phosphite and tris(nonylphenyl)phosphite may be mentioned, while as the sulfur-based antioxidant, dilauryl thiodipropionate etc. may be mentioned.

The photostabilizer may be any of an ultraviolet absorber such as one of the benzophenone type, salicylic acid ester type, benzotriazole type, cyanoacrylate type, or metal complex type, one of the hindered amine type (HALS), or other one trapping radicals generated due to light. Among these as well, a HALS is a compound having a piperidine structure which does not color the radiation-sensitive resin composition used in the present disclosure much and is good in stability, so is preferable. As specific compounds, bis(2,2,6,6-tetramethyl-4-piperidyl)sebacate, 1,2,2,6,6-pentamethyl-4-piperidyl/tridecyl 1,2,3,4-butanetetracarboxylate, bis(1-octyloxy-2,2,6,6-tetramethyl-4-piperidyl)sebacate, etc. may be mentioned.

The method of preparation of a radiation-sensitive resin composition used in the present disclosure is not particularly limited. The constituents forming the radiation-sensitive resin composition need only be mixed by a known method.

The method of mixing is not particularly limited, but it is preferable to mix solutions or dispersions obtained by dissolving or dispersing the constituents forming the radiation-sensitive resin composition in solvents. Due to this, the radiation-sensitive resin composition is obtained in the form of a solution or dispersion.

The method of dissolving or dispersing the constituents forming the radiation-sensitive resin composition in a solvent may be based on an ordinary method. Specifically, it is possible to use stirring using a stirrer and magnetic stirrer, a high speed homogenizer, a disperser, a planetary stirrer, a twin-screw stirrer, a ball mill, a triple roll, etc. Further, after dissolving or dispersing the constituents in the solvent, for example, the mixture may be filtered using a pore size 0.5 μm or so filter.

The solids concentration of the radiation-sensitive resin composition of the present disclosure is usually 1 to 70 wt %, preferably 5 to 60 wt %, more preferably 10 to 50 wt %.

(Method of Forming Insulating Film and Microlens)

Next, the method of using the above-mentioned radiation-sensitive resin composition to form the insulating film and microlens for forming the infrared LED of the present disclosure will be explained while illustrating the infrared LED 10 according to one embodiment of the present disclosure shown in FIG. 1.

First, on the element body formed by the epitaxial wafer 20, n-dot electrodes 30, and p-pad electrode 40, a resin film for forming the protective insulating film 50 (below, referred to as the "insulating film-use resin film") is formed on the main surface at the side where the p-pad electrode 40 is formed using the above-mentioned radiation-sensitive resin composition. The method of forming the insulating film-use resin film comprised of the radiation-sensitive resin composition is not particularly limited, but the coating method or film lamination method etc. may be mentioned. The coating method is preferable.

The "coating method", for example, is the method comprising coating the radiation-sensitive resin composition, then heating it to dry to remove the solvent. As the method of coating the radiation-sensitive resin composition, for example, various methods such as the spray method, spin coat method, roll coat method, die coat method, doctor blade method, rotating coat method, bar coat method, screen print method, and inkjet method can be employed. The heating and drying conditions differ according to the type and ratio of the constituents, but are usually 30 to 150° C., preferably 60 to 120° C., usually for 0.5 to 90 minutes, preferably 1 to 60 minutes, more preferably 1 to 30 minutes.

The "film lamination method" is a method comprising coating a radiation-sensitive resin composition on a substrate for forming a B-stage film such as a resin film and metal film, then heating and drying it to remove the solvent to obtain the B-stage film, then laminating this B-stage film. The heating and drying conditions may be suitably selected in accordance with the types and ratios of content of the constituents, but the heating temperature is usually 30 to 150° C. and the heating time is usually 0.5 to 90 minutes. The film lamination may be performed by using a press bonding machine such as a press laminator, press machine, vacuum laminator, vacuum press, and roll laminator.

Further, the formed insulating film-use resin film is subjected to a cross-linking reaction to obtain the protective insulating film 50 shown in FIG. 1. The method of performing the cross-linking reaction may be suitably selected in accordance with the type of the cross-linking agent (C) contained in the radiation-sensitive resin composition, but is usually heating. The heating method may be, for example, performed using a hot plate, oven, etc. The heating temperature is usually 180 to 250° C., while the heating time is suitably selected by the area or thickness of the protecting insulating film 50 to be obtained, the equipment used, etc. For example, when using a hot plate, it is usually 5 to 60 minutes, while when using an oven, it is usually 30 to 90 minutes in range. The heating may be performed, as necessary, in an inert gas atmosphere. As the inert gas, one which does not contain oxygen and which does not cause the resin film to oxidize may be used. For example, nitrogen, argon, helium, neon, xenon, krypton, etc. may be mentioned. Among these as well, nitrogen and argon are preferable. In particular, nitrogen is preferable. In particular, an inert gas having an oxygen content of 0.1 vol % or less, preferably 0.01 vol % or less, in particular nitrogen, is preferable. These inert gases may be respectively used alone or as two types or more combined.

Next, to form the microlens 60 on the thus formed protective insulating film 50, a resin film comprised of the above-mentioned radiation-sensitive resin composition (below, referred to as a "microlens-use resin film") is further formed. The method of forming the microlens-use resin film comprised of the radiation-sensitive resin composition is not particularly limited, but in the same way as the above-mentioned insulating film-use resin film, the coating method or film lamination method etc. may be mentioned. The coating method is preferable. The manufacturing conditions when using the coating method or the film lamination method etc. may also be made ones similar to the insulating film-use resin film explained above.

Note that, as the radiation-sensitive resin composition for forming the microlens 60, one having the same composition as the radiation-sensitive resin composition for forming the protective insulating film 50 may be used. Alternatively, one having a different composition may be used. However, from the viewpoint of reducing as much as possible the difference in refractive index between the protective insulating film 50 and the microlens 60, it is preferable to use one where at least the cyclic olefin polymer (A) is the same, more preferable to use one comprised of entirely the same constituents, still more preferable to use one with entirely the same constituents in the same ratios of contents of the constituents.

Next, the formed microlens-use resin film is patterned to form a shape corresponding to the microlens 60. As the method for patterning the microlens-use resin film, for example, the method of irradiating the microlens-use resin film before patterning with an activating radiation to form a latent pattern and then bringing a development solution into contact with the microlens-use resin film having the latent pattern etc. may be mentioned. Note that, at this time, usually, when manufacturing the infrared LED 10 shown in FIG. 1, the LED 10 is produced by obtaining an array sheet on which a plurality of infrared LEDs 10 having the constitutions shown in FIG. 1 are arrayed on a wafer and dicing this array sheet, so when patterning the microlens-use resin film, it is patterned by dot patterns corresponding to the infrared LEDs 10 forming the array sheet.

The activating radiation is not particularly limited so long as one which can activate the radiation-sensitive compound (B) contained in the radiation-sensitive resin composition and change the alkali solubility of the radiation-sensitive resin composition containing the radiation-sensitive compound (B). Specifically, ultraviolet rays, single wavelength ultraviolet rays such as g-rays and i-rays, KrF excimer laser light, ArF excimer laser light, and other light; particle beams such as electron beams; etc. may be used. As the method for selectively firing these activating radiation in a pattern shape to form a latent pattern, ordinary methods may be followed. For example, the method of using a reduced projection exposure apparatus etc. to irradiate light beams such as ultraviolet rays, g-rays, i-rays, KrF excimer laser light, and ArF excimer laser light through a desired mask pattern or the method of lithography using particle beams of electron beams etc. may be used.

When using light as the activating radiation, it may be single wavelength light or mixed wavelength light. The irradiation conditions are suitably selected in accordance with the activating radiation used, but, for example, in the case of using wavelength 200 to 450 nm light, the amount of irradiation is usually 10 to 5,000 mJ/cm$^2$, preferably 50 to 1,500 mJ/cm$^2$ in range. This is determined in accordance with the irradiation time and illuminance. After irradiation by the activating radiation in this way, if necessary, the microlens-use resin film is heat treated at 60 to 130° C. or so in temperature for 1 to 2 minutes or so.

Next, the latent pattern formed on the microlens-use resin film before patterning is developed to manifest it. As the developing solution, usually an aqueous solution of an alkali compound is used. As the alkali compound, for example, an alkali metal salt, amine, or ammonium salt may be used. The alkali compound may be an inorganic compound or an organic compound. As specific examples of these compounds, alkali metal salts such as sodium hydroxide, potassium hydroxide, sodium carbonate, sodium silicate, and sodium metasilicate; ammonia water; primary amines such as ethylamine and n-propylamine; secondary amines such as diethylamine and di-n-propylamine; tertiary amines such as triethylamine and methyldiethylamine; quaternary ammonium salts such as tetramethyl ammonium hydroxide, tetraethyl ammonium hydroxide, tetrabutyl ammonium hydroxide, and choline; alcohol amines such as dimethyl ethanolamine and triethanol amine; cyclic amines such as pyrrole, piperidine, 1,8-diazabicyclo[5.4.0]undec-7-ene, 1,5-diasabicyclo[4.3.0]non-5-ene, and N-methylpyrrolidone; etc. may be mentioned. These alkali compounds may be used respectively alone or as two or more types combined.

As the aqueous medium of the alkali aqueous solution, water or an aqueous organic solvent such as methanol or ethanol may be used. The alkali aqueous solution may be one including a surfactant etc. added in a suitable amount.

As the method of bringing the developing solution into contact with the resin film having the latent pattern, for example, a method such as the puddle method, spray method, and dipping method is used. The development is usually performed at 0 to 100° C., preferably 5 to 55° C., more preferably 10 to 30° C. in range usually for 30 to 180 seconds in range.

The microlens-use resin film formed with a pattern corresponding to the microlens 60 in this way can be rinsed by a rinse solution so as to remove the development residue in accordance with need. After the rinsing, the remaining rinse solution is removed by compressed air or compressed nitrogen.

Furthermore, in accordance with need, to deactivate the radiation-sensitive compound (B) contained in the radiation-sensitive resin composition, the entire surface of the electronic device can be irradiated with activating radiation. For irradiating the activated radiation, the method illustrated for formation of the latent pattern can be utilized. At the same time as irradiation or after irradiation, the microlens-use resin film may be heated. As the heating method, for example, the method of heating the electronic device on a hot plate or in an oven may be mentioned. The temperature is usually 80 to 300° C., preferably 100 to 200° C. in range.

Next, the thus formed patterned microlens-use resin film is subjected to the melt flow process to make the microlens-use resin film obtained in a shape with a straight angle cross-sectional shape due to development deform so that the sharp angle parts become gentler and change the shape to a pattern of a gentle shape with no sharp angles. Specifically, it is made to deform to a gentle semispherical shape (that is, a shape corresponding to the microlens 60 shown in FIG. 1), that is, is made to form a secondary pattern and thereby obtain the microlens 60 shown in FIG. 1. Note that, as the heating method in the melt flow process, for example, the method of heating on a hot plate or in an oven may be mentioned. Further, the heating temperature in the melt flow process is not particularly limited, but is usually 140 to 170° C., preferably 150 to 160° C., while the heating time is usually 2 to 15 minutes, preferably 5 to 10 minutes.

Further, in the formation of the secondary pattern by the above-mentioned melt flow process, it is possible to promote the advance of the cross-linking of the microlens-use resin film by the cross-linking agent (C) with a good balance simultaneously with the formation of the secondary pattern by the melt flow process and thereby possible to cause the formation of the cross-linked structure required for holding the pattern shape of the microlens-use resin film after the secondary patterning. That is, according to the above-mentioned radiation-sensitive resin composition, it is possible to easily form the secondary pattern by the melt flow process. On the other hand, in the obtained microlens-use resin film after the secondary patterning, even when exposed to a temperature higher than the temperature at the time of performing the melt flow process, the pattern shape can be suitably maintained. Therefore, there is also the advantage that a temperature margin can be broadened at the time of the melt flow process.

According to the present disclosure, the protective insulating film 50 and microlens 60 are formed using the above-mentioned radiation-sensitive resin composition. The above-mentioned radiation-sensitive resin composition comprise a cyclic olefin polymer (A), a radiation-sensitive compound (B), and a cross-linking agent (C) and can give a resin film excellent in light transmission ability (in particular, light transmission ability in the infrared region (700 to 1500 nm)) and further excellent in heat resistant shape retention ability. Therefore, by using such a radiation-sensitive resin composition to form the protective insulating film 50 and microlens 60, it is possible to make the obtained infrared LED 10 one high in brightness and high in reliability.

In particular, according to the present disclosure, by using the above-mentioned radiation-sensitive resin composition, it is possible to form a resin film excellent in light transmission ability, so even when making the thickness t1 of the protective insulating film 50 formed using this a relatively thick one of preferably 1 to 10 μm, more preferably 2 to 7 μm, still more preferably 3 to 5 μm, a sufficient light transmission ability can be secured. Further, by making the thickness greater in this way, it is possible to make the insulation performance of the protective insulating film 50 a sufficient one and thereby possible to secure a high reliability.

Note that, the thickness t2 of the microlens 60 is not particularly limited, but from the viewpoint of suppressing the diffusion of light, it is preferably 0.5 to 5 μm, more preferably 1 to 4 μm, still more preferably 2 to 3 μm. Note that, the "thickness t2 of the microlens 60", as shown in FIG. 1, means the maximum height of the micro lens 60 (thickness at the highest location when viewed from the protective insulating film 50).

Further, the ratio of the thickness t1 of the protective insulating film 50 and the thickness t2 of the microlens 60 is preferably a "thickness t1 of protective insulating film: thickness t2 of microlens" of preferably 1:1 to 10:1, more preferably 2:1 to 7:1, still more preferably 3:1 to 5:1. By making the ratio of these the above range, it is possible to further improve the light gathering efficiency.

In addition, according to the present disclosure, since the protective insulating film 50 and the microlens 60 are both formed using the above-mentioned radiation-sensitive resin composition comprising a cyclic olefin polymer (A), a radiation-sensitive compound (B), and a cross-linking agent (C), the difference in refractive index between the protective insulating film 50 and the microlens 60 can be made a small one of 0.1 or less. For this reason, according to the present disclosure, it is possible to effectively prevent the drop in brightness due to the difference in refractive index and thereby possible to suitably raise the brightness of the infrared LED 10. Note that, the difference in refractive index between the protective insulating film 50 and the microlens 60 is more preferably 0.05 or less, still more preferably 0.02 or less. Note that, from the viewpoint of reducing more the difference in refractive index, it is preferable to make the radiation-sensitive resin composition for forming the protective insulating film 50 and the radiation-sensitive resin composition for forming the microlens 60 as close in composition as possible. It is preferable to use ones where at least the cyclic olefin polymer (A) is the same, more preferable to use ones comprised of entirely the same constituents, still more preferable to use ones with entirely the same constituents in the same ratios of contents of the constituents.

EXAMPLES

Below, examples and comparative examples will be given to explain the present disclosure more specifically. In the examples, "parts" are based on weight unless otherwise indicated.

Example 1

<Preparation of Cyclic Olefin Polymer (A-1)>

100 parts of a monomer mixture comprised of 40 mol % of N-phenyl-bicyclo[2.2.1]hept-5-ene-2,3-dicarboxyimide (NBPI) and 60 mol % of 4-hydroxycarbonyltetracyclo[6.2.1.1$^{3,6}$.0$^{2,7}$]dodec-9-ene (TCDC), 2.0 parts of 1,5-hexadiene, 0.02 part of (1,3-dimethylimidazolin-2-ylidene) (tricyclohexylphosphine)benzylidene ruthenium dichloride (synthesized by the method described in Org. Lett., vol. 1, p. 953, 1999), and 200 parts of diethylene glycol ethyl methyl ether were charged into a nitrogen-substituted glass pressure resistant reactor and stirred while causing them to react at 80° C. for 4 hours to obtain a polymerization reaction solution.

Further, the obtained reaction solution was placed into an autoclave and stirred at 150° C. at a hydrogen pressure of 4 MPa for 5 hours to cause a hydrogenation reaction and obtain a polymer solution containing the cyclic olefin polymer (A-1). The polymerization conversion rate of the obtained cyclic olefin polymer (A-1) was 99.7%, the weight average molecular weight converted to polystyrene was 7,150, the number average molecular weight was 4,690, the molecular weight distribution was 1.52, and the hydrogenation rate was 99.7%. Further, the solids content of the polymer solution of the obtained cyclic olefin polymer (A-1) was 34.4 wt %.

<Preparation of Radiation-Sensitive Resin Composition>

As a cyclic olefin polymer (A), 291 parts of a polymer solution of the cyclic olefin polymer (A-1) obtained in Synthesis Example 1 (100 parts as cyclic olefin polymer (A-1)), as a radiation-sensitive compound (B), 35 parts of a condensate of 1,1,3-tris(2,5-dimethyl-4-hydroxyphenyl)-3-phenylpropane and 1,2-naphthoquinone diazide-5-sulfonic acid chloride, as a cross-linking agent (C), 50 parts of epoxylated butanetetracarboxylic acid tetrakis(3-cyclohexenylmethyl)-modified ε-caprolactone, and as a solvent, 600 parts of diethylene glycol ethyl methyl ether were mixed and made to dissolve, then the mixture was filtered by a pore size 0.45 μm polytetrafluoroethylene filter to prepare a radiation-sensitive resin composition.

Further, the above obtained radiation-sensitive resin composition was used in accordance with the following methods to evaluate the transmittance and heat resistant shape retention ability after patterning.

<Transmittance>

Figure 2:
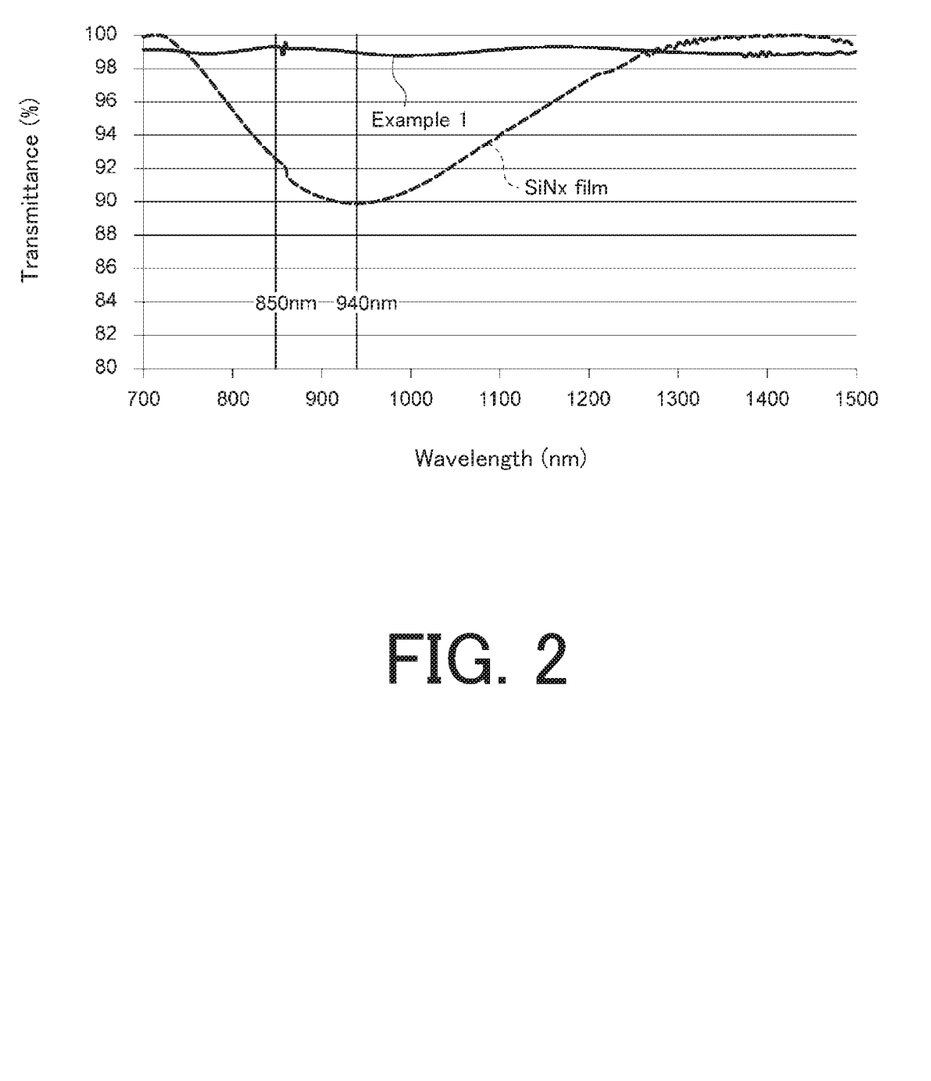
FIG. 2 is a view showing the results of measurement of the transmittance in an example.

The above obtained radiation-sensitive resin composition was spin coated on a glass substrate and dried using a hot plate at 110° C. for 120 seconds to form a film having a thickness after drying of 3.0 μm. This resin film was irradiated with 1,000 mW/cm² ultraviolet rays to bleach it (deactivation treatment of radiation-sensitive compound (B)), then this was fired in a nitrogen atmosphere at 230° C. for 60 minutes to thereby fabricate a glass substrate sample for evaluation of transmittance. Further, the obtained glass substrate sample was used to measure the transmittance in the infrared wavelength band by an ultraviolet visible near infrared spectrophotometer ("LAMBDA900", made by PerkinElmer). The measurement results are shown in FIG. 2. FIG. 2 also shows the results of a glass substrate sample on which an inorganic insulating film comprised of $SiN_x$ was formed. Note that, the glass substrate sample on which an inorganic insulating film comprised of $SiN_x$ was formed was manufactured using a same glass substrate to the above and forming an inorganic insulating film comprised of $SiN_x$ by the sputtering method.

As will be clear from FIG. 2 as well, a resin film formed using a radiation-sensitive resin composition comprised of a cyclic olefin polymer (A) having a protonic polar group, a radiation-sensitive compound (B), and a cross-linking agent (C) has a transmittance of 98% or more in the 700 to 1500 nm wavelength and further transmittances at 850 nm and 940 nm usually used in infrared LEDs of both 99% or more, i.e., was particularly good in results.

On the other hand, an inorganic insulating film comprised of $SiN_x$ had a transmittance at 850 nm of 92% and, further, a transmittance at 940 nm of 90%, i.e., was inferior in transmission ability in both cases.

<Heat Resistant Shape Retention Ability after Patterning>

Using a similar method to the fabrication of the above glass substrate sample for evaluation of transmittance, a silicon wafer substrate on which a thickness 3.0 μm heat curing resin film was formed was further spin coated with the above obtained radiation-sensitive resin composition. A hot plate was used to dry this at 110° C. for 120 seconds to thereby form a film with a thickness after drying of 3.0 μm (total thickness combined with the previously fabricated heat curing resin film of 6.0 μm). This resin film was irradiated with ultraviolet rays with a light intensity of 10 mW/cm² (W corresponding to J/s) through a mask of patterns of 3.5 μm dots and 1.5 μm spaces in the air for 30 seconds. Next, a tetramethyl ammonium hydroxide 0.4% solution was used for development at 23° C. for 100 seconds, then ultrapure water was used to rinse the film for 30 seconds to form a positive type 3.5 μm dot patterned resin film.

Further, the cross-sectional shape of the obtained patterned resin film was observed by a scan type electron microscope (SEM) and the width "a" between dot patterns was measured based on the SEM image (magnification: 10,000×). Next, the entire surface of the patterned resin film was irradiated with ultraviolet rays of a light intensity of 10 mW/cm² in the air for 60 seconds, then a hot plate was used to treat the substrate on which this pattern was formed at 140 to 170° C. over 10 minutes by first heat treatment (melt flow). The patterned resin film was made to melt to cause the patterns to deform from dot shapes to semispherical shapes (microlens shapes). Further, the substrate made to melt flow was treated using a hot plate at 230° C. for 30 minutes by second heat treatment (post baking) to thereby form semispherical shaped parts (microlens) with thicknesses of the vertex parts of 2.5 μm. Further, the cross-sectional shapes of the patterns after post baking were examined by an SEM in the same way as explained above and the widths "b" between dot patterns were measured based on the SEM images. Using the obtained measurement results, the difference (a-b) of the width "a" between the dot patterns after formation of the patterned resin film and the width "b" between the dot patterns after post baking was found. The heat resistant shape retention ability of the patterned resin films were evaluated in accordance with the following evaluation criteria. Note that, the above evaluation was conducted for 10 locations in the dot patterns formed.

[Evaluation Criteria]

Excellent: Patterns comprised of semispherical shapes with (a-b) of 0.5 μm or more.

Good: Patterns comprised of semispherical shapes with (a-b) of over 0.5 μm to 1 μm.

Fair: Patterns comprised semispherical shapes with (a-b) over 1 μm to 1.5 μm.

Poor: Patterns completely melted and fusing with adjoining patterns.

As a result of the above measurement, in the pattern resin film obtained using the radiation-sensitive resin composition obtained above, each of the 10 locations evaluated were "excellent" or "good" in the above evaluation criteria. The microlens 60 shown in FIG. 2 could be formed well, and the heat resistant shape retention ability was also excellent.

<Evaluation of Example 1>

From the above results, it can be confirmed that by using radiation-sensitive resin compositions each comprised of a cyclic olefin polymer (A) having a protonic polar group, a radiation-sensitive compound (B), and a cross-linking agent (C), it is possible to form a protective insulating film 50 excellent in transmission ability in a 700 to 1500 nm wavelength band, in particular, at 850 nm and 940 nm, and a microlens 60 excellent in transmission ability in such a wavelength band and further excellent in heat resistant shape retention ability. In particular, in the 700 to 1500 nm wavelength band, the transmittance is 98% or more and, further, the transmittances at 850 nm and 940 nm usually used in infrared LEDs are both 99% or more, so even if making the thickness t1 of the protective insulating film 50 a relatively thick 3 to 5 μm and making the thickness t2 of the microlens 60 2 to 3 μm, excellent transmission abilities can be realized. Furthermore, by being able to make the thickness of the protective insulating film 50 greater, it is possible to realize an excellent transmission ability while sufficiently securing the insulation performance by the protective insulating film 50. Further, it is possible to form a microlens 60 excellent in heat resistant shape retention ability, so it is possible to make the obtained infrared LED 10 excellent in reliability.

In addition, according to the present disclosure, it is possible to form both the protective insulating film 50 and microlens 60 using radiation-sensitive resin compositions each comprised of a cyclic olefin polymer (A) having a protonic polar group, a radiation-sensitive compound (B), and a cross-linking agent (C), so it is possible to make the difference of the refractive indexes of these 0.1 or less and thereby possible to suitably raise the brightness of the infrared LED.

Due to the above, according to the present disclosure, it is possible to suitably provide an infrared LED having a high brightness and a high reliability.

REFERENCE SIGNS LIST

10 . . . infrared LED
20 . . . epitaxial wafer
21 . . . AlGaAs substrate
22 . . . epitaxial layer
23 . . . transparent conductive film
30 . . . n-dot electrode
40 . . . p-pad electrode
50 . . . protective insulating film
60 . . . microlens

The invention claimed is:

1. An infrared LED comprising an insulating film formed on an element and a microlens formed on the insulating film, wherein the insulating film and the microlens are formed using radiation-sensitive resin compositions each containing a cyclic olefin polymer (A) having a protonic polar group, a radiation-sensitive compound (B), and a cross-linking agent (C), and
a ratio of a thickness of the insulating film and a thickness of the microlens is a "thickness of insulating film: thickness of microlens" of 1:1 to 10:1.

2. The infrared LED according to claim 1, wherein a thickness of the insulating film is 1 to 10 μm and a thickness of the microlens is 0.5 to 5 μm.

3. The infrared LED according to claim 1, wherein a difference of a refractive index of the insulating film and a refractive index of the microlens is 0.1 or less.

4. The infrared LED according to claim 1, wherein the insulating film and the microlens are formed respectively using radiation-sensitive resin compositions containing the same polymer as the cyclic olefin polymer (A).

5. The infrared LED according to claim 4, wherein the insulating film and the microlens are formed respectively using radiation-sensitive resin compositions comprised of entirely the same constituents.

6. The infrared LED according to claim 5, wherein the insulating film and the microlens are formed respectively using radiation-sensitive resin compositions comprising entirely the same constituents in the same ratios of content.

* * * * *